United States Patent [19]

Schommer

[11] 4,207,813
[45] Jun. 17, 1980

[54] MARKING APPARATUS AND METHOD THEREFOR

[75] Inventor: Oliver J. Schommer, Phoenix, Ariz.

[73] Assignee: Tech-Aid Inc., Phoenix, Ariz.

[21] Appl. No.: 970,244

[22] Filed: Dec. 18, 1978

[51] Int. Cl.² .......................................... B41F 17/00
[52] U.S. Cl. ........................................ 101/4; 101/32
[58] Field of Search ................ 101/3 R, 4, 9–11, 101/32

[56] References Cited

U.S. PATENT DOCUMENTS

| 443,119 | 12/1890 | Slick | 101/4 |
| 2,348,566 | 5/1944 | Papazian | 101/3 R |
| 3,847,078 | 11/1974 | Krembel, Jr. | 101/3 R |
| 4,159,676 | 7/1979 | Joyce et al. | 101/4 X |

FOREIGN PATENT DOCUMENTS 487689  1/1976  U.S.S.R. ........................................ 101/4

Primary Examiner—Clifford D. Crowder
Attorney, Agent, or Firm—Harry M. Weiss

[57] ABSTRACT

This relates to an apparatus and method for marking printed circuit boards with numeric, alphabetic and/or symbolic indicia. Insertion of a printed circuit board causes a plurality of punches to come to rest on the board. Further insertion releases a striking hammer from its rest position permitting it to fall on the punches thus impressing the required markings on the board. The downward motion of the hammer causes a motor to be activated which returns the hammer to its rest position after which the motor will be turned off.

21 Claims, 6 Drawing Figures

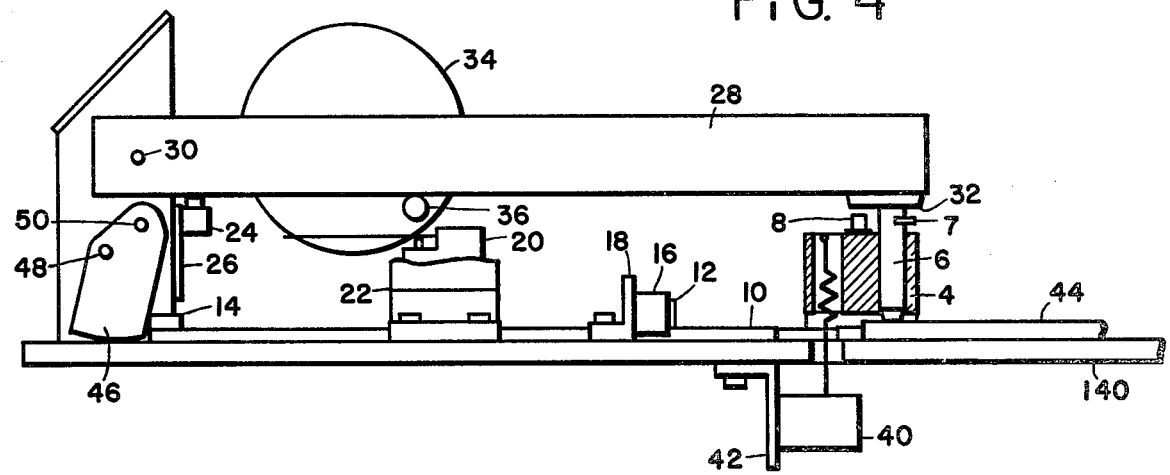
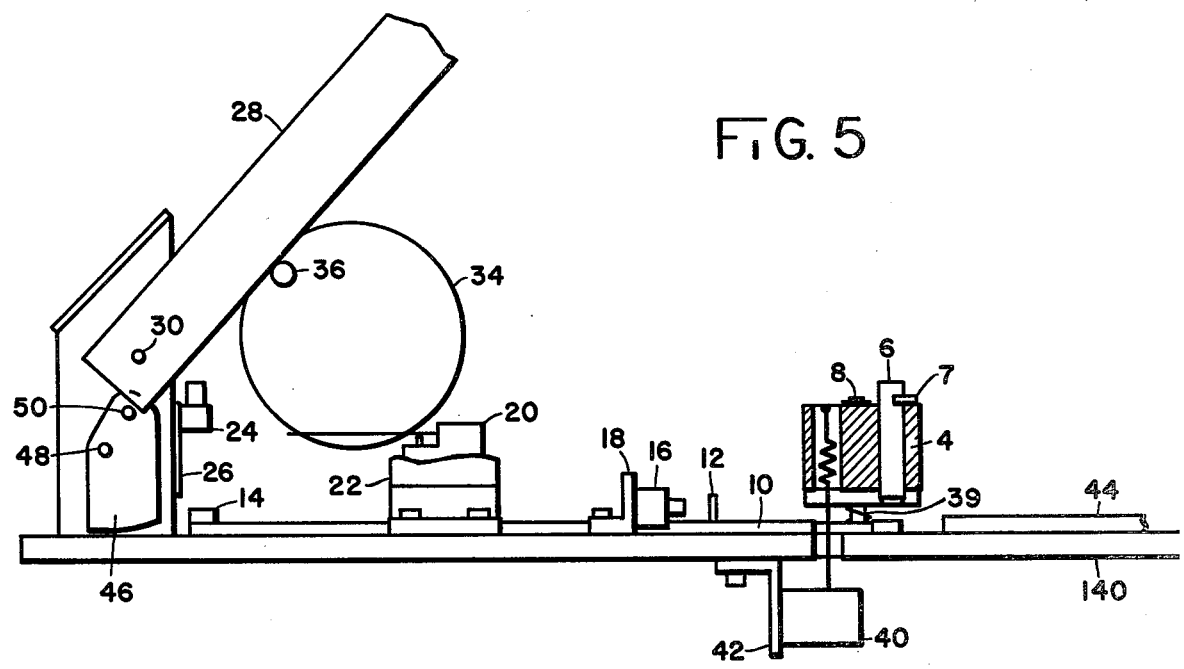

4,207,813

MARKING APPARATUS AND METHOD THEREFOR

BACKGROUND OF THE INVENTION

1. Field of the Invention

This relates generally to an apparatus and method for marking items with various forms of indicia (alphabetic, numeric and/or symbolic) and, more particularly, to an apparatus and method for marking printed circuit boards with identifying indicia employing a plurality of punches which automatically engage the board to be marked when the board is properly positioned.

2. Description of the Prior Art

It is generally necessary to mark printed circuit boards with various forms of indicia to aid in identifying individual boards or groups of boards. This is useful for maintainence and quality control purposes and has been accomplished in the past by producing the indicia simultaneously with the construction of the conductor pattern on the board and in the same manner; i.e. the indicia is produced by appropriate masking and etching techniques. Obviously, this process is time consuming, complex and requires the attention of highly trained personnel to avoid damaging the printed circuit board.

SUMMARY OF THE INVENTION

It is therefore an object of the present invention to provide an apparatus and/or method for marking and identifying printed circuit boards.

It is a further object of the invention that the inventive marking apparatus be simple in structure and easy to use without a substantial amount of training on the part of the operator.

It is a further object of the invention that the apparatus and/or method be capable of marking the printed circuit board with various forms of indicia such as numeric, alphabetic, symbolic or any combination thereof.

Finally, it is an object of the invention to provide an apparatus for marking printed circuit boards wherein the entire marking process is automatic once the printed circuit board is properly positioned.

According to a broad aspect of the invention there is provided marking apparatus comprising of at least one punch, first means for striking said at least one punch and second means coupled to said first means for returning said first means to a ready position for carrying out another striking operation.

According to a further aspect of the invention there is provided an apparatus for marking printed circuit boards with various forms of indicia comprising at least one punch, first means for positioning said at least one punch on a printed circuit board, second means for striking said at least one punch and third means coupled to said second means for returning said second means to a ready position for carrying out another striking operation.

According to a still further aspect of the invention there is provided a method for marking objects comprising the steps of actuating a striking hammer to fall and strike at least one punch carrying a designated mark and automatically returning the striking hammer to a ready position for carrying out another striking operation.

The foregoing and other objects, features and advantages of the invention will be apparent from the following, more detailed description of a preferred embodiment taken in conjunction with the accompanying drawings.

BRIEF DESCRIPTION OF THE DRAWINGS

FIG. 4 illustrates the marking apparatus at a point in time when the indicia is being impressed onto the printed circuit board;

FIG. 5 illustrates the return of the marking apparatus to its rest state after a printed circuit board has been marked.

DESCRIPTION OF THE PREFERRED EMBODIMENT

Figure 1:
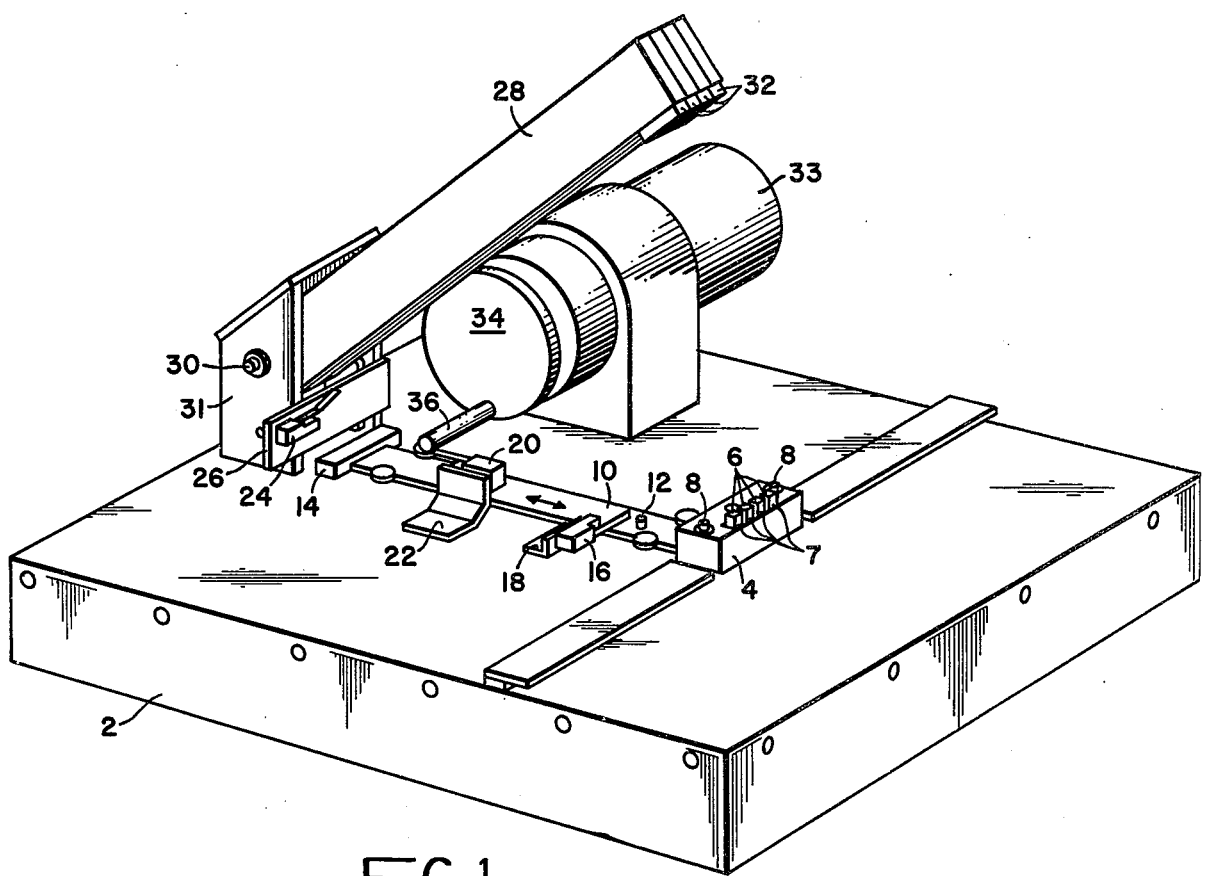
FIG. 1 is an isometric view of the inventive printed circuit board marking apparatus.
Figure 2:
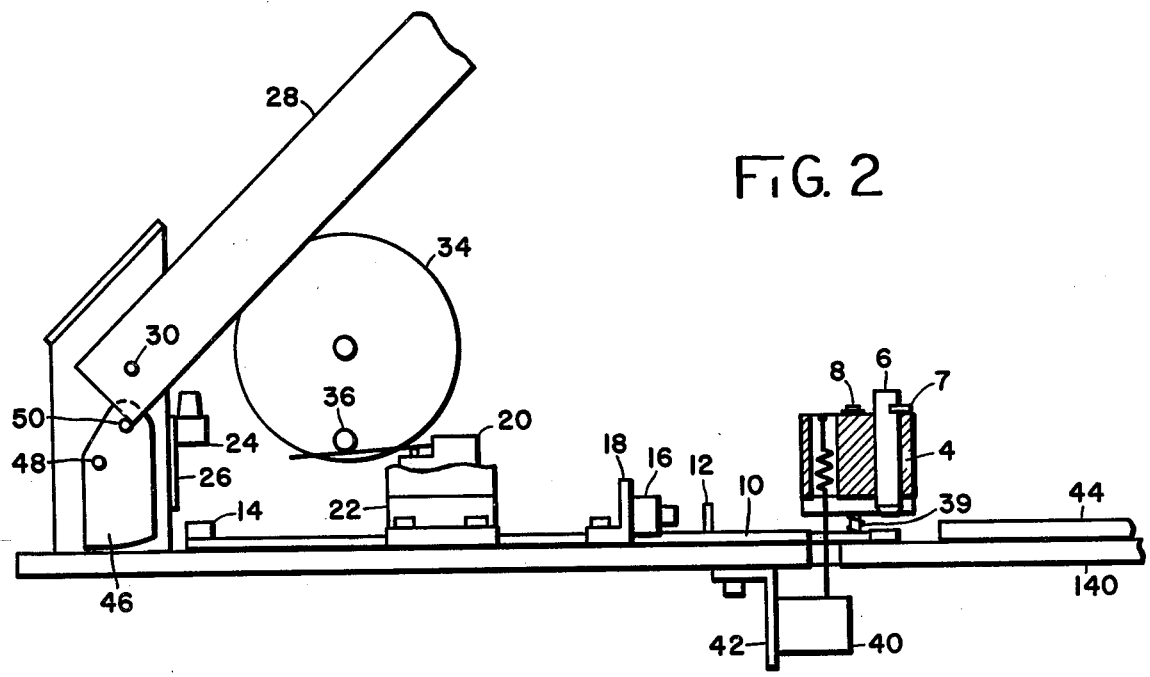
FIG. 2 illustrates the marking apparatus in its rest state prior to insertion of a printed circuit board.

Referring to FIG. 2, there is shown a base 140 which the remainder of the marking apparatus is mounted. A solenoid controlled punch housing 4 has disposed therein a plurality of punches 6. While only 4 punches are shown in FIG. 1 and throughout the remainder of the drawings, it should be clear that any number of punches may be accommodated. Each of the punches is supported in the punch housing by a pin 7. The punch housing 4 is resiliently coupled for vertical movement on guide pins 8 and normally resides in a position somewhat above the surface of base 140.

A slide tongue 10 is disposed on base 140 and is coupled so as to permit longitudinal movement along the surface of base 140 as is indicated by the arrow shown on tongue 10. The sliding tongue is terminated with an abutment 14, the purpose of which will be more fully described below.

Adjacent to the sliding tongue is a microswitch 16 mounted on member 18 which is in turn coupled to base 140 Sliding tongue 10 carries a pin 12 which makes contact with switch 16 in a manner to be described below. A second microswitch 20 supported by member 22 which is coupled to housing 2, is positioned so as to be contacted by projection 36.

A metal hammer 28 is provided with a striking area 32 consisting of a hard metal preferably hardened steel. Hammer 28 is pivotably coupled on pivot pin or rod 30. A third switch 24 is mounted on plate 26 so as to be contacted when hammer 28 falls on punches 6.

A spring is used (not shown) to return the tongue 10 to its original position shown in FIG. 2. This will eject the printed circuit board away from its position under the punches 6.

Also shown in FIG. 1 is a motor 33 mounted on base 140 for rotating surface 34 in a counter-clockwise direction.

FIG. 2 illustrates some of the internal workings and positioning of the apparatus shown in FIG. 1 prior to activation. As can be seen, the punch housing 4 is biased above base 140 by spring 39. It is only when solenoid 40 mounted on member 42 is activated that the punch housing 4 and the punches therein are lowered to engage a printed circuit board. Within compartment 31 (FIG. 1), a retaining lever 46 is mounted for pivotable movement about pin 48. Retaining lever 46 is equipped with a retaining pin 50 which supports hammer 28 in the position shown in FIG. 2. The apparatus, as shown in FIG. 2, is in the rest position awaiting actuation. In this position, member 36 eccentrically mounted on surface 34 is shown contacting switch 20 whereas switches 16 and 24 are uncontacted.

Figure 3:
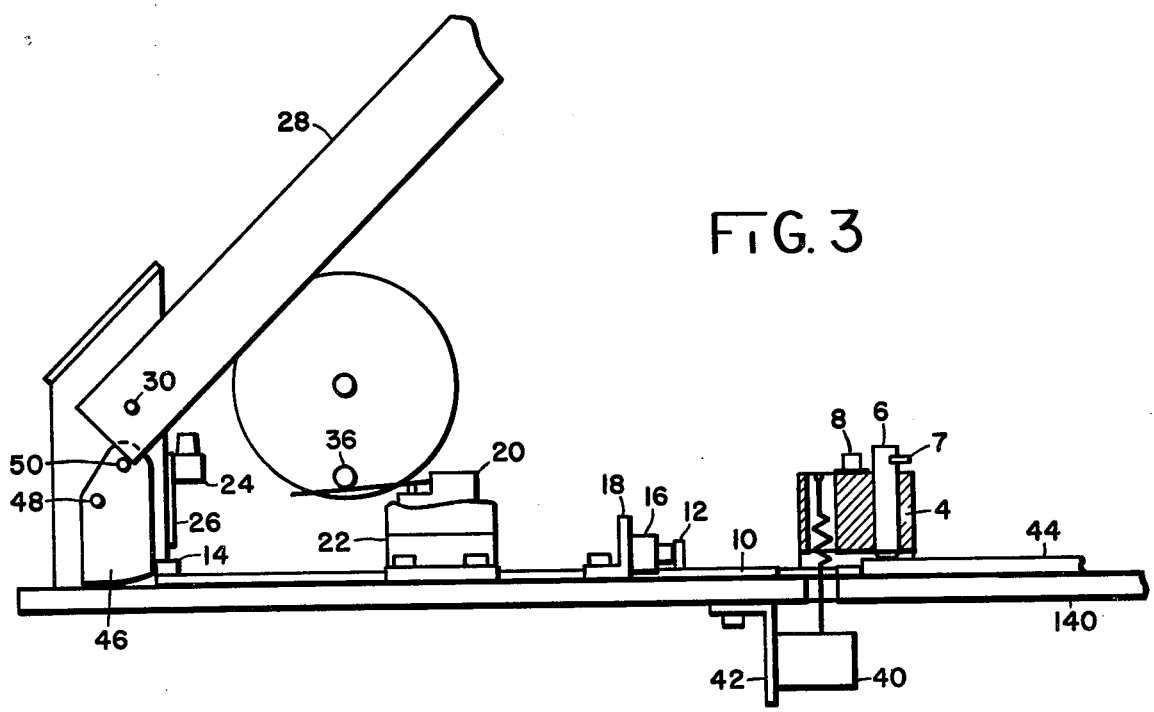
FIG. 3 illustrates the marking apparatus after insertion of a printed circuit board to be marked and just prior to activation of the marking apparatus.

Referring to FIG. 3, printed circuit board 44 is inserted beneath punch housing 4 engaging tongue 10 and causing it to slide towards retaining lever 46. As this occurs, pin 12 is brought into contact with microswitch 16 which activates solenoid 40. This causes punch housing 4 to be pulled down against the force of spring 39 (FIG. 2) thus permitting punches 6 to rest on printed circuit board 44.

Additional movement of sliding tongue 10 will cause retaining lever 46 to rotate about pivot 48 in a clockwise direction. This releases hammer 28 permitting it to fall under the force of gravity. Striking member 32 coupled to hammer 28 will strike punches 6 producing the required indentations or markings to be impressed on printed circuit board 44. The downward movement of hammer 28 closes switch 24 which in turn activates motor 33 (FIG. 1). This results in rotation of surface 34 and eccentrically mounted member 36 in a counter-clockwise direction.

As the now marked printed circuit board 44 is removed, pin 12 on tongue 10 disengages switch 16 turning off solenoid 40 and allowing punch housing 4 to rise on guide rods 8 under the force of spring 39. Further, as surface 34 is rotating counter-clockwise, member 36 engages hammer 28 to lift it upward about pivot pin 30. Since abutment 14 is no longer engaging retaining lever 46, retaining lever 46 which is resiliently mounted returns in a counter-clockwise direction to the rest position shown in FIG. 2. Thus, when hammer 28 is sufficiently raised, it will again be retained in position by retaining pin 50. When surface 34 and member 36 rotates sufficiently such that member 36 again engages switch 20, motor 33 (FIG. 1) will be turned off preventing further rotation until subsequent actuation by insertion of another printed circuit board.

A spring (not shown) is used to return the retaining lever 46 to its rest position (as shown in FIG. 2) after the metal hammer 28 is raised to its ready position for carrying out another striking operation.

Figure 6:
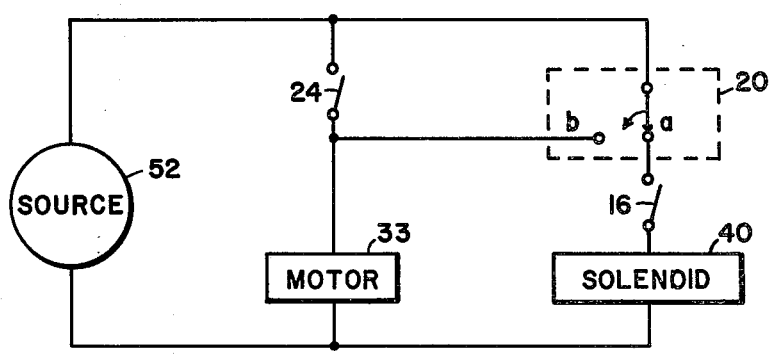
FIG. 6 is a diagram illustrating how the motor and punch solenoid of the apparatus are energized.

FIG. 6 illustrates the electrical connections between a source of energy 52, motor 33 and solenoid 40 via switches 16, 20 and 24 shown in FIGS. 1–5. As can be seen, switch 20 is a two position switch ("a" and "b") which is normally in the "a" position. Thus when switch 16 is closed as a result of engagement with pin 12 on sliding tongue 10, energy is coupled to the solenoid 40 to bring the punch housing down. When the hammer falls, switch 24 is closed completing the circuit to motor 33. When surface 34 begins to rotate, switch 20 assumes the "b" position. Therefore, although switch 24 will again be opened when hammer 28 has been sufficiently raised, the circuit including motor 33 is still complete via switch 20. After a complete rotation of surface 34, switch 20 again assumes the "a" position and, removal of the printed circuit board will cause pin 12 to disengage from switch 16 deactivating solenoid 40.

While the invention has been particularly shown and described with reference to a preferred embodiment for marking printed circuit boards, it should be understood by those skilled in the art that changes in form and details, including the types of items marked, may be made without departing from the true spirit and scope of the invention.

What is claimed is:

1. Marking apparatus comprising:
   at least one punch;
   first means for striking said at least one punch; and
   second means coupled to said first means for returning said first means to a ready position for carrying out another striking operation, said first means comprises:
   a striking hammer;
   third means for supporting said striking hammer in its ready position; and
   fourth means for tripping said third means allowing said striking hammer to impact said at least one punch, said third means comprises:
   a pivotably mounted retaining lever;
   a retaining pin mounted on said retaining lever for engaging said striking hammer to support it in its ready position; and
   a slide member for engaging said retaining lever causing it to rotate, which rotation disengages said retaining pin from said striking hammer allowing said hammer to fall on said at least one punch.

2. Marking apparatus according to claim 1 wherein said slide member is actuated by an item to be marked.

3. Marking apparatus according to claim 2 wherein said second means comprises a motor coupled to said striking hammer which is activated when said hammer falls to return said hammer to its ready position.

4. Marking apparatus according to claim 2 wherein said second means comprises:
   a first switch which is turned on when said hammer falls;
   a motor coupled to said first switch and energized thereby for returning said hammer to its ready position; and
   a second switch coupled to said motor for turning said motor off after said hammer has reached its ready position.

5. Marking apparatus according to claim 4 wherein said first switch is positioned so as to be contacted by said hammer when said hammer falls.

6. Marking apparatus according to claim 5 further including a lifting member coupled to said motor for engaging said hammer to lift it.

7. Marking apparatus according to claim 6 wherein said lifting member is eccentrically mounted on a surface which is rotated by said motor.

8. Marking apparatus according to claim 2 further including fifth means for bringing said at least one punch into engagement with an item to be marked before said at least one punch is struck by said striking hammer.

9. Marking apparatus according to claim 8 wherein said fifth means comprises:
   a solenoid coupled to said at least one punch; and
   a third switch responsive to said slide member for energizing said solenoid.

10. Marking apparatus according to claim 9 wherein a pin is mounted on said slide member and wherein said third switch is positioned so as to be contacted by said pin when said slide member is sufficiently actuated.

11. An apparatus for marking printed circuit boards with various forms of indicia, comprising:
    at least one punch;
    first means for positioning said at least one punch on a printed circuit board;
    second means for striking said at least one punch; and third means coupled to said second means for returning said second means to a ready position for carrying out another striking operation, said second means comprises:

a striking hammer;

fourth means for supporting said hammer in its ready position; and fifth means for tripping said fourth means allowing said striking hammer to impact said at least one punch whereby said printed circuit board is marked, said fourth means comprises:

a pivotably mounted retaining lever;

a retaining pin mounted on said retaining lever for engaging said hammer to support it in its ready position; and a slide member for engaging said retaining lever causing it to rotate, which rotation disengages said retaining pin from said hammer permitting said hammer to fall on said at least one punch.

12. An apparatus according to claim 11 wherein said slide member is urged against said retaining lever by said printed circuit board.

13. An apparatus according to claim 12 wherein said third means comprises a motor coupled to said hammer which is activated when said hammer falls to return said hammer to its ready position.

14. An apparatus according to claim 13 wherein said first switch is positioned so as to be contacted by said hammer when said hammer falls.

15. An apparatus according to claim 14 further including a lifting member coupled to said motor for engaging said hammer to lift it.

16. An apparatus according to claim 15 wherein said lifting member is eccentrically mounted on a surface which is rotated by said motor.

17. An apparatus according to claim 16 wherein said first means comprises:

a resiliently mounted housing for supporting said at least one punch;

a solenoid coupled to said housing; and a third switch responsive to said slide member for energizing said solenoid.

18. An apparatus according to claim 17 wherein a printed circuit board to be marked is inserted beneath said punch housing to engage said slide member and wherein said third switch is activated by a pin on said slide member when said slide member has been sufficiently moved.

19. An apparatus according to claim 12 wherein said third means comprises:

a first switch which is turned on when said hammer falls;

a motor coupled to said first switch and energized thereby for returning said hammer to its ready position; and a second switch coupled to said motor for turning said motor off after said hammer has reached its ready position.

20. A method for marking objects comprising the steps of:

actuating a striking hammer to fall and strike at least one punch carrying a designated mark; and automatically returning the striking hammer to a ready position for carrying out another striking operation, said striking hammer being actuated by pivoting a pivotably mounted retaining lever having a hammer retaining pin mounted thereon to permit the striking hammer to fall and strike said one punch.

21. A method in accordance with claim 20 including the step of initiating the pivoting of said pivotably mounted retaining lever only upon the insertion of one of the objects to be marked in position beneath said one punch.

* * * * *